United States Patent
Ipenza

(10) Patent No.: US 10,224,968 B2
(45) Date of Patent: Mar. 5, 2019

(54) DIGITAL UP-CONVERTER AND METHOD THEREFOR

(71) Applicant: NXP USA, INC., Austin, TX (US)

(72) Inventor: Sammy Johnatan Carbajal Ipenza, Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/659,687

(22) Filed: Jul. 26, 2017

(65) Prior Publication Data

US 2019/0036557 A1    Jan. 31, 2019

(51) Int. Cl.
*H04B 1/04*    (2006.01)

(52) U.S. Cl.
CPC ....... *H04B 1/04* (2013.01); *H04B 2001/0491* (2013.01)

(58) Field of Classification Search
CPC ...................................... H04B 1/04
USPC ...................................... 375/295
See application file for complete search history.

(56) References Cited

U.S. PATENT DOCUMENTS

| | | | |
|---|---|---|---|
| 5,854,813 A | 12/1998 | Rottinghaus et al. | |
| 5,880,687 A | 3/1999 | May et al. | |
| 7,102,548 B1 | 9/2006 | Wang et al. | |
| 7,613,760 B1 | 11/2009 | Esposito et al. | |
| 8,649,471 B1 * | 2/2014 | Charbonneau | H04L 27/2624 |
| | | | 341/132 |
| 2004/0192229 A1 | 9/2004 | Morris et al. | |
| 2005/0267924 A1 | 12/2005 | Jensen | |
| 2006/0160492 A1 * | 7/2006 | Jensen | H03L 7/0891 |
| | | | 455/76 |
| 2015/0147987 A1 | 5/2015 | Harris et al. | |

OTHER PUBLICATIONS

Cui, X., et al., "Design and Implementation of Digital Up Converter for Homenet"; 2005 IEEE Conference on Electron Devices and Solid-State Circuits; DOI: 10.1109/EDSSC.2005.1635382; Date of Conference: Dec. 19-21, 2005.

De Figueiredo, F.A., et al. "FPGA Design and Implementation of Digital Up-Converter using Quadrature Oscillator"; 2013 IEEE Jordan Conference on Applied Electrical Engineering and Computing Technologies (AEECT); DOI: 10.1109/AEECT.2013.6716423; Date of Conference: Dec. 3-5, 2013.

Hogenauer, Eugene B., "An Economical Class of Digital Filters for Decimation and Interpolation" Published in IEEE Transactions on Acoustics, Speech, and Signal Processing; DOI: 10.1109/TASSP.1981.1163535; (vol. 29, Issue: 2, Apr. 1981).

(Continued)

*Primary Examiner* — Lihong Yu
(74) *Attorney, Agent, or Firm* — Daniel D. Hill

(57) ABSTRACT

A digital up-converter (DUC) includes a cascaded combinator-differentiator (CCD) filter, a low-pass filter, an up-sampler, and a down-sampler. The combinator includes a number of series-connected combinator stages and the differentiator includes a number of series-connected differentiator stages. The CCD filter functions similarly to an interpolator filter, filtering and up-sampling the baseband signal out of the baseband. In one embodiment, the up-sampling factor is twice the number of channels (2N). The disclosed DUC does not require complex mixers or oscillators. Also, the low-pass filter of the DUC does not require a narrow transition band, so the number of coefficients for the low-pass filter is relatively low.

18 Claims, 4 Drawing Sheets

(56) References Cited

OTHER PUBLICATIONS

Lin, F., et al. "Efficient Design of Digital up Converter for WCDMA in FPGA Using System Generator"; 2009 International Conference on Information Engineering and Computer Science; DOI: 10.1109/ICIECS.2009.5366979; Date of Conference: Dec. 19-20, 2009.

* cited by examiner

DIGITAL UP-CONVERTER AND METHOD THEREFOR

BACKGROUND

Field

This disclosure relates generally to electrical circuits, and more specifically, to a digital up-converter and method therefor.

Related Art

A digital up-converter (DUC) is used in a communications system to translate one or more channels of data from a baseband signal to a passband signal that is modulated at a set of one or more specified radio frequency (RF) or intermediate frequency (IF) carriers. FIG. 1 illustrates prior art DUC 12 in a transmit path 10 of a communications system. DUC 12 receives a digital baseband signal and provides an up-converted signal to digital-to-analog converter (DAC) 14. The analog signal is then filtered and amplified by analog filter and power amplifier 16 before being provided to an antenna and transmitted. DUC 12 includes interpolation filter 18, digital mixer 20, and digital oscillator 22. DUC 12 may be part of one of a number of channels (N). DUC 12 performs the interpolation to increase a sample rate. Filtering is used to provide spectral shaping and rejection of interpolation images. Digital mixer 20 performs mixing of a digital oscillator 22 to shift the signal spectrum to the desired carrier frequencies. FIG. 2 illustrates prior art DUC 32 in a transmit path 30 of a communication system. DUC 32 includes interpolation filter 34, complex mixer 36, digital oscillator 40, and summation circuit 38. In DUC 32, interpolation filter 34 receives the digital baseband signal at a sample rate $f_s$ and the baseband signal is decomposed into real and imaginary parts that are provided to complex mixer 36. Complex mixer 36 performs a complex multiplication with two oscillators for each component I and Q with $\cos(\omega_c t)$ and $\sin(\omega_c t)$ from oscillator 40. Both I and Q components are then provided to inputs of a summation circuit 38 where they are added together. DUC 32 provides an up-sampled signal having a sample rate $f_o = 2Mf_s$ to an input of DAC 14, where M is the total number of available channels and $f_s$ is the input sample rate.

The prior art digital up-converters (DUCs) in FIG. 1 and FIG. 2 use complex circuits such as IQ mixers and oscillators which add complexity to the DUC, thus increasing the cost of the communications system. Therefore, what is needed is a DUC that does not have these complex circuits.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
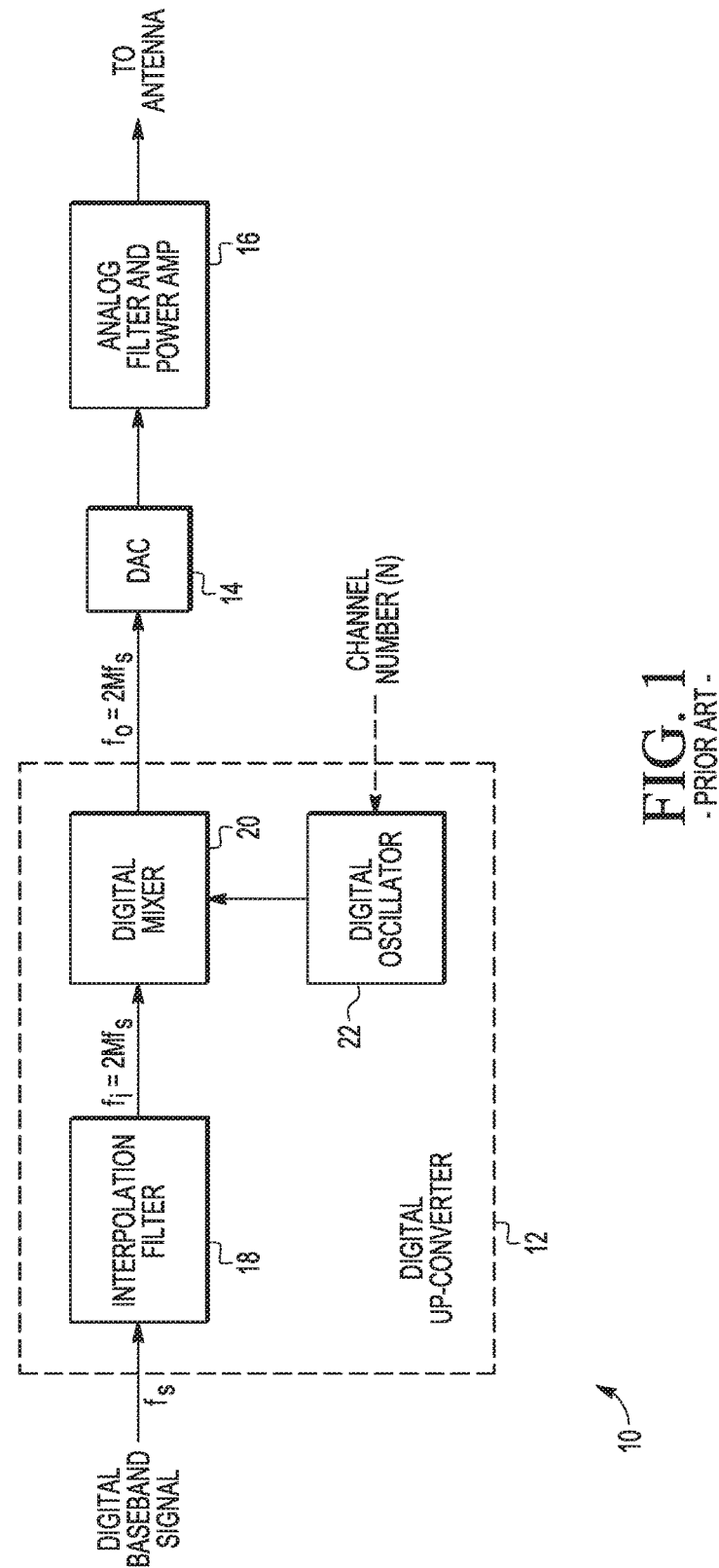
FIG. 1 illustrates a digital up-converter in accordance with the prior art.

Generally, there is provided, a DUC having a cascaded combinator-differentiator (CCD) filter, a low-pass filter, an up-sampler, and a down-sampler. The combinator includes a number of series-connected combinator stages and the differentiator includes a number of series-connected differentiator stages. The cascaded combinator-differentiator filter functions similarly to an interpolator filter, filtering and up-sampling the baseband signal out of the baseband. In one embodiment, the up-sampling rate is twice the number of channels (2N). The disclosed DUC does not require complex mixers or oscillators. Also, the low-pass filter of the DUC does not require a narrow transition band, so the number of coefficients for the low-pass filter is relatively low.

In one embodiment, there is provided, a digital up-converter comprising: a combinator having an input coupled to receive a digital baseband signal, and an output; a first up-sampler having an input coupled to the output of the combinator, and an output; a differentiator having an input coupled to the output of the first up-sampler, and an output; a second up-sampler having an input coupled to the output of the differentiator, and an output; and a low-pass filter having an input coupled to the output of the second up-sampler, and an output for providing an up-converted digital signal. The combinator may comprise: a summation element having a positive input for receiving the digital baseband signal, a negative input, and an output; and a delay element having an input for receiving the digital baseband signal, and an output coupled to the negative input of the summation element. The differentiator may comprise: a summation element having positive input coupled to the output of the first up-sampler, a negative input, and an output; and a delay element having an input coupled to the output of summation element, and an output coupled to the negative input of the summation element. The digital up-converter may further comprise a down-sampler having an input coupled to the output of the low-pass filter, and an output. The digital up-converter may comprise a plurality of channels, wherein the digital baseband signal may be sampled at an input sample rate, and wherein the output of the differentiator may have a sample rate equal to two times the input sample rate times a channel number of a channel of the plurality of channels. The digital up-converter may comprise a plurality of channels, each channel of the plurality of channels may have a channel number, and wherein the first up-sampler may have an up-sampling factor equal to two times the channel number of one of the plurality of channels. The low-pass filter may be characterized as being one of a finite impulse response (FIR) filter or an infinite impulse response (IIR) filter. The low-pass filter may have a cut-off frequency equal to $2\pi/M$, where M is a total number of available channels of the digital up-converter. The combinator may be one of a plurality of series-connected combinators, and wherein the differentiator may be one of a plurality of series-connected differentiators.

In another embodiment, there is provided, a digital up-converter comprising: a plurality of channels, each of the plurality of channels comprising: a plurality of combinators connected together in series, each of the plurality of combinators comprising: a summation element having a positive input, a negative input, and an output; and a delay element having an input coupled to the positive input of the summation element, and an output coupled to the negative input of the summation element; a first up-sampler having an input coupled to the plurality of combinators, and an output; a plurality of differentiators connected together in series, a first differentiator of the plurality of differentiators having an input coupled to the output of the first up-sampler, each of the plurality of combinators comprising: a summation element having positive input coupled to the output of the first up-sampler, a negative input, and an output; and a delay element having an input coupled to the output of summation element, and an output coupled to the negative input of the summation element; a second up-sampler having an input coupled to the output of a last differentiator of the plurality of differentiators, and an output; and a low-pass filter having an input coupled to the output of the second up-sampler, and an output for providing an up-converted digital signal. The low-pass filter may be characterized as being one of a finite impulse response (FIR) filter or an infinite impulse response (IIR) filter. The low-pass filter may have a cut-off frequency equal to $2\pi/M$, where M is a total number of the plurality of channels. The first up-sampler may have a sample rate equal to 2N, where N is equal to a channel number of one of the plurality of channels. The second up-sampler may have an up-sampling factor equal to M, where M is equal to the total of number of the plurality of channels. The digital up-converter may further comprise a down-sampler having an input coupled to the output of the low-pass filter, and an output. The down-sampler may have a down-sampling factor equal to N, where N is equal to a channel number of one of the plurality of channels.

In yet another embodiment, there is provided, a method for up-converting a digital signal with a digital up-converter from a first sample rate to a second sample rate, the method comprising: filtering the digital signal at the first sample rate using a plurality of serially-connected combinator stages; up-sampling the filtered digital signal to a first intermediate sample rate; differentiating the filtered digital signal at the first intermediate sample rate using a plurality of serially-connected differentiator stages; up-sampling the differentiated digital signal to a second intermediate sample rate; low-pass filtering the differentiated digital signal; and down-sampling the low-pass filtered digital signal to the second sample rate. The method may further comprise providing the digital up-converter with a plurality of channels. Up-sampling the low-pass filtered digital signal to the second sample rate may further comprise up-sampling by an up-sampling factor M, where M is equal to the total of number of the plurality of channels. Up-sampling the filtered digital signal to the first intermediate sample rate may further comprise up-sampling by an up-sampling factor 2N, where N is equal to a channel number of one of the plurality of channels. Low-pass filtering may comprise low-pass filtering with a low-pass filter comprising one of either a finite impulse response (FIR) filter or an infinite impulse response (IIR). The low-pass filter may have a cut-off frequency equal to $2\pi/M$, where M is equal to the total of number of the plurality of channels. Down-sampling the low-pass filtered digital signal to the second sample rate may further comprise down-sampling by a down-sampling factor N, where N is equal to a channel number of one of the plurality of channels.

Figure 3:
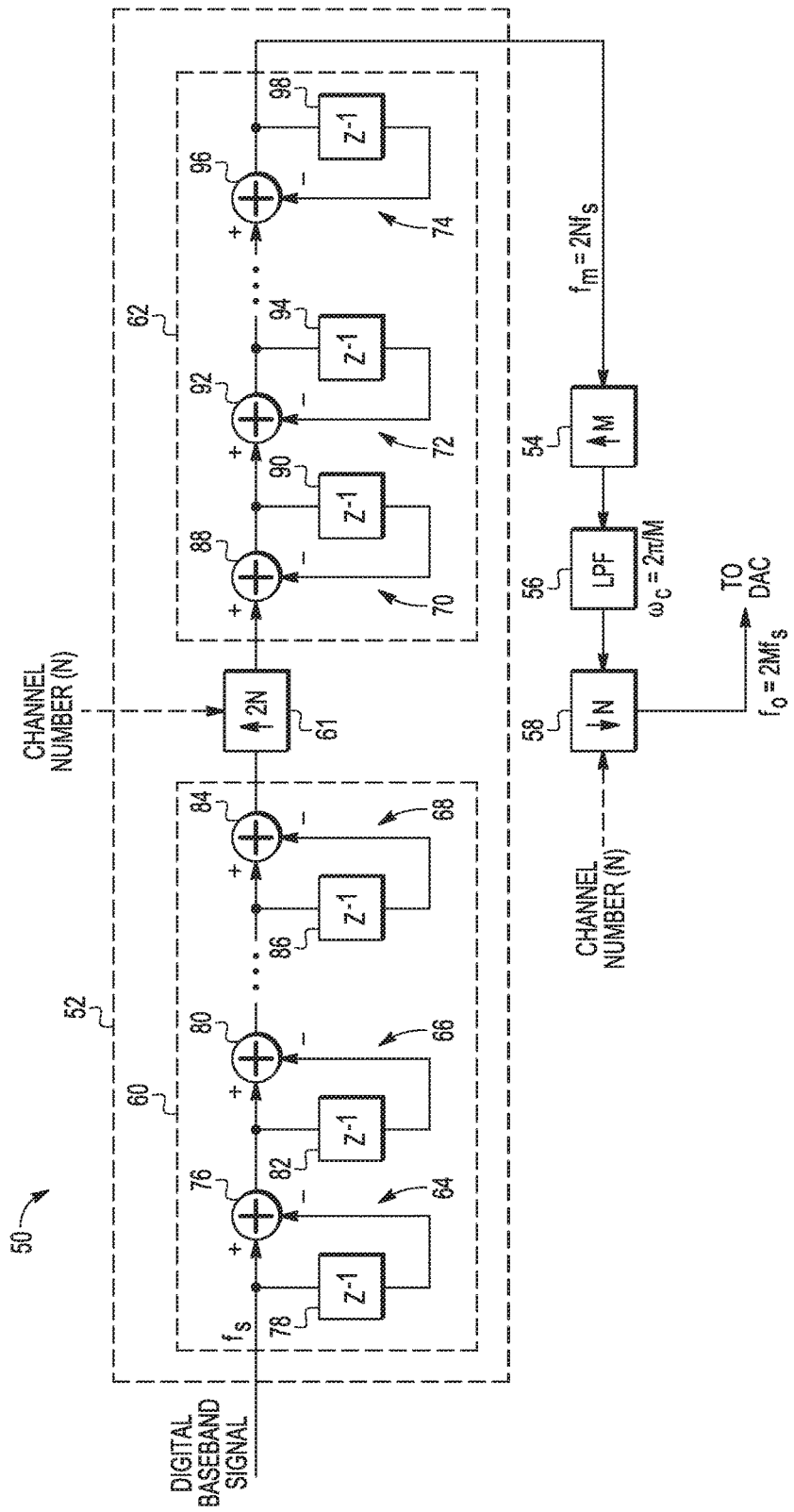
FIG. 3 illustrates a digital up-converter in accordance with an embodiment.

FIG. 3 illustrates digital up-converter 50 in accordance with an embodiment. Digital up-converter (DUC) 50 is for one channel of a DUC that may have multiple channels, and includes multi-stage cascaded combinator-differentiator (CCD) filter 52, up-sampler 54, low-pass filter 56, and down-sampler 58. DUC 50 is clocked by a system clock, which is not illustrated in FIG. 1 for the purposes of simplicity and clarity. Multi-stage CCD filter 52 includes combinator 60, up-sampler 61, and differentiator 62. Combinator 60 includes a plurality of series-connected combi-nator stages represented by combinator stages 64, 66, and 68. Combinator stage 64 includes summation element 76 and delay element 78. Each delay element provides a delay labeled $Z^{-1}$. Combinator stage 66 includes summation element 80 and delay element 82. Combinator stage 68 includes summation element 84 and delay element 86. In combinator stage 64, summation element 76 has a positive input connected to receive a signal labeled "DIGITAL BASEBAND SIGNAL", a negative input, and an output. Delay element 78 has an input connected to the positive input of summation element 76, and an output connected to the negative input of summation element 76. In combinator stage 66, summation element 80 has a positive input connected to the output of summation element 76, a negative input, and an output. Delay element 82 has an input connected to the positive input of summation element 80, and an output connected to the negative input of summation element 80. In combinator stage 68, summation element 84 has a positive input coupled to the output of summation element 80, a negative input, and an output. Delay element 86 has an input connected to the positive input of summation element 84, and an output connected to the negative input of summation element 84. There may be additional combinator stages between combinator stage 66 and combinator stage 68 as indicated by an ellipsis " . . . " in FIG. 3. Up-sampler 61 has an input connected to the output of summation element 84, and an output. The output of summation element 84 functions as the output of combinator 60.

Up-sampler 61 up-samples a signal received from the output of combinator 60 and provides an output signal having a first intermediate sample rate equal to 2N times the input sample rate $f_s$, where N is equal to a channel number of one of the plurality of channels that needs to be up-sampled. In another embodiment, up-sampler 61 may have a different up-sampling factor.

Differentiator 62 includes a plurality of series-connected differentiator stages represented by differentiator stages 70, 72, and 74. Differentiator stage 70 includes summation element 88 and delay element 90. Each delay element provide a delay labeled $Z^{-1}$. Differentiator stage 72 includes summation element 92 and delay element 94. Differentiator stage 74 includes summation element 96 and delay element 98. In differentiator 70 stage, summation element 88 has a positive input connected to the output of up-sampler 61, a negative input, and an output. Delay element 90 has an input connected to the output of summation element 88, and an output connected to the negative input of summation element 88. In differentiator stage 72, summation element 92 has a positive input connected to the output of summation element 88, a negative input, and an output. The positive input of summation element 88 functions as the input of differentiator 62. Delay element 94 has an input connected to the output of summation element 92, and an output connected to the negative input of summation element 92. In differentiator stage 74, summation element 96 has a positive input coupled to the output of summation element 92, a negative input, and an output. Delay element 98 has an input connected to the output of summation element 96, and an output connected to the negative input of summation element 96. The output of summation element 96 functions as the output of differentiator 62 and provides an intermediate sample rate of $f_m = 2NF_s$. Differentiator 62 may have additional stages connected between differentiator stages 72 and 74 as indicated by the ellipsis.

Figure 2:
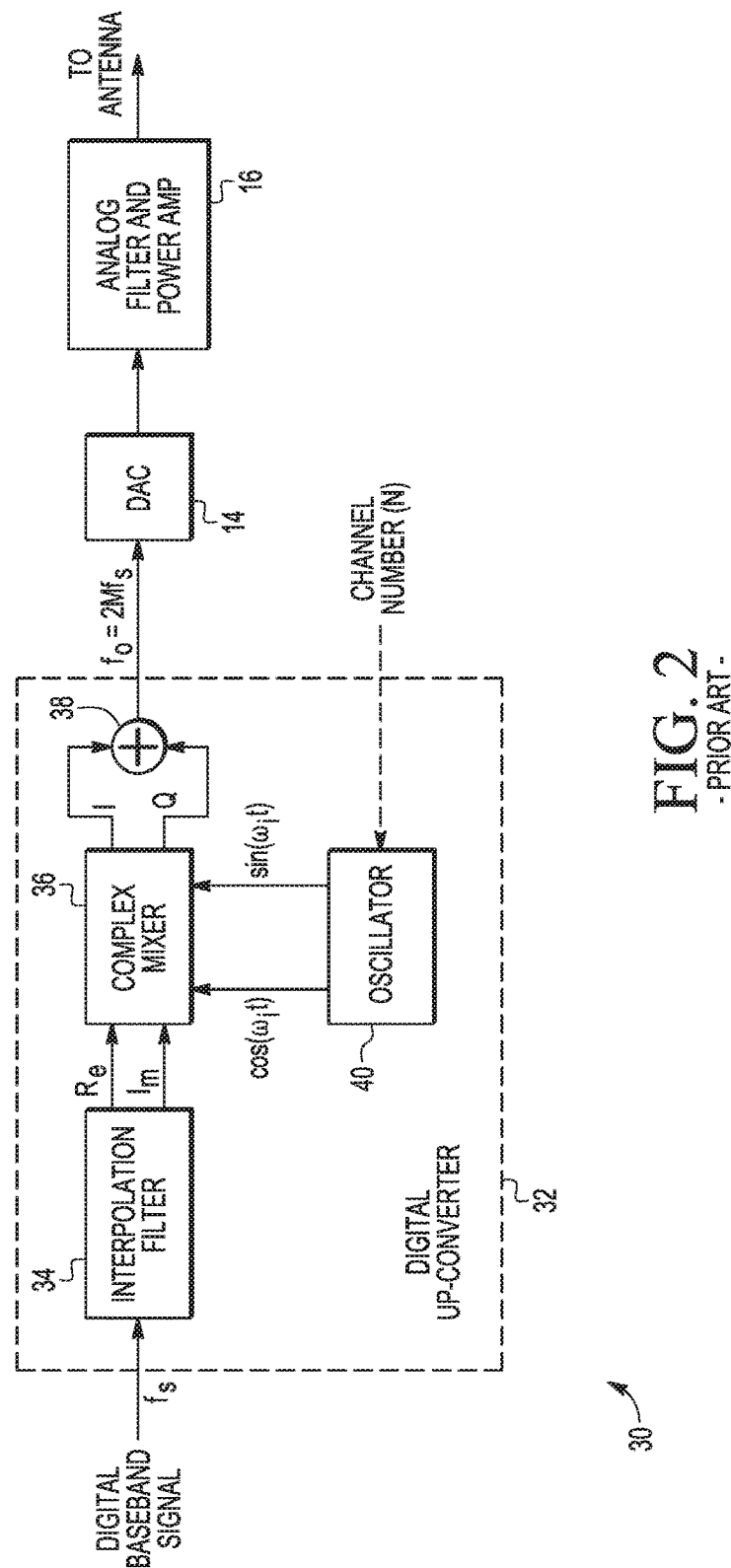
FIG. 2 illustrates another digital up-converter in accordance with the prior art.

Up-sampler 54 has an input connected to the output of differentiator 62, and an output. Up-sampler 54 up-samples the signal received from differentiator 62 to a second intermediate sample rate by applying an up-sampling factor of M, where M is the total number of available channels of DUC 50. Low-pass filter (LPF) 56 has an input connected to the output of up-sampler 54, and an output. In one embodiment, LPF 56 is characterized as being a finite impulse response (FIR) filter having a cut-off frequency $\omega_c=2\pi/M$. In another embodiment, LPF 56 can be any kind of low-pass filter such as an infinite impulse response (IIR) filter. Down-sampler 58 has an input connected to the output of LPF 56, and an output for providing an intermediate output signal having a sample rate $f_o=2Mf_s$. The output signal may be provided to, for example, a DAC such as DAC 14 illustrated in FIG. 1 and FIG. 2.

In operation, the function of a DUC, such as DUC 50 is to translate one or more channels of data from baseband to a pass-band intermediate frequency. DUC 50 translates the baseband signal using several up-sampling stages and a down-sampling stage. The different channels differ from each other in the channel number used by up-sampler 61 and down sampler 58. The translated data has modulated carriers at a set of one or more specified frequencies. Depending on the application, the specified frequencies can be either radio frequency (RF) or intermediate frequency (IF). The sample rate at the input to DUC 50 is relatively low; for example, the symbol rate at baseband of a digital communications system, while the output sample rate is a much higher IF rate, generally, the input sample rate to a DAC. The DAC converts the digital samples to an analog waveform for further analog processing and frequency conversion. DUC 50 performs this translation without a complex mixer and oscillator. Instead, DUC 50 uses multi-stage cascade combinator-differentiator (CCD) filter 52. CCD 52 is similar to a cascade integrator-comb (CIC) filter, except that CCD 52 uses differentiator 62 instead of an integrator. Differentiator 62 can be distinguished from an integrator because a summation element of each differentiator stage has a positive input and a negative input; whereas, a summation element of a CIC integrator stage has two positive inputs.

CCD filter 52 works like an interpolator filter, filtering the frequencies out of the baseband. In the illustrated embodiment, the up-sampling rate is determined to be twice the number of available channels. The number of stages of combinator 60 and differentiator 62 is determined by the desired signal quality and rejection in the stopband. In one embodiment, combinator 60 and differentiator 62 have an equal number of stages. Including more stages for combinator 60 and differentiator 62 provides a better signal-to-noise ratio (SNR). An output intermediate sample rate of CCD 52 is $f_m=2Nf_s$, where $f_s$ is a sample rate of the input digital baseband signal. Low-pass filter 56 has a cut-off frequency $\omega_c$ equal to $2\pi/M$, where M is equal to the total of number of the plurality of channels. Down-sampler 58 down samples the output at a rate equal to the channel number N. Up-sampler 54 up-samples by M and defines the output IF sampling rate of DUC 50 as $f_o=2Mf_s$. The channel number N can be selected to be between 0 and M−1. Therefore, the total number of channels available is M as illustrated in FIG. 4.

DUC 50 performs interpolation to increase the sample rate, filtering to provide spectral shaping and rejection of interpolation images, and mixing to shift the signal spectrum to the desired carrier frequencies without using a complex IQ mixer or oscillator.

Figure 4:
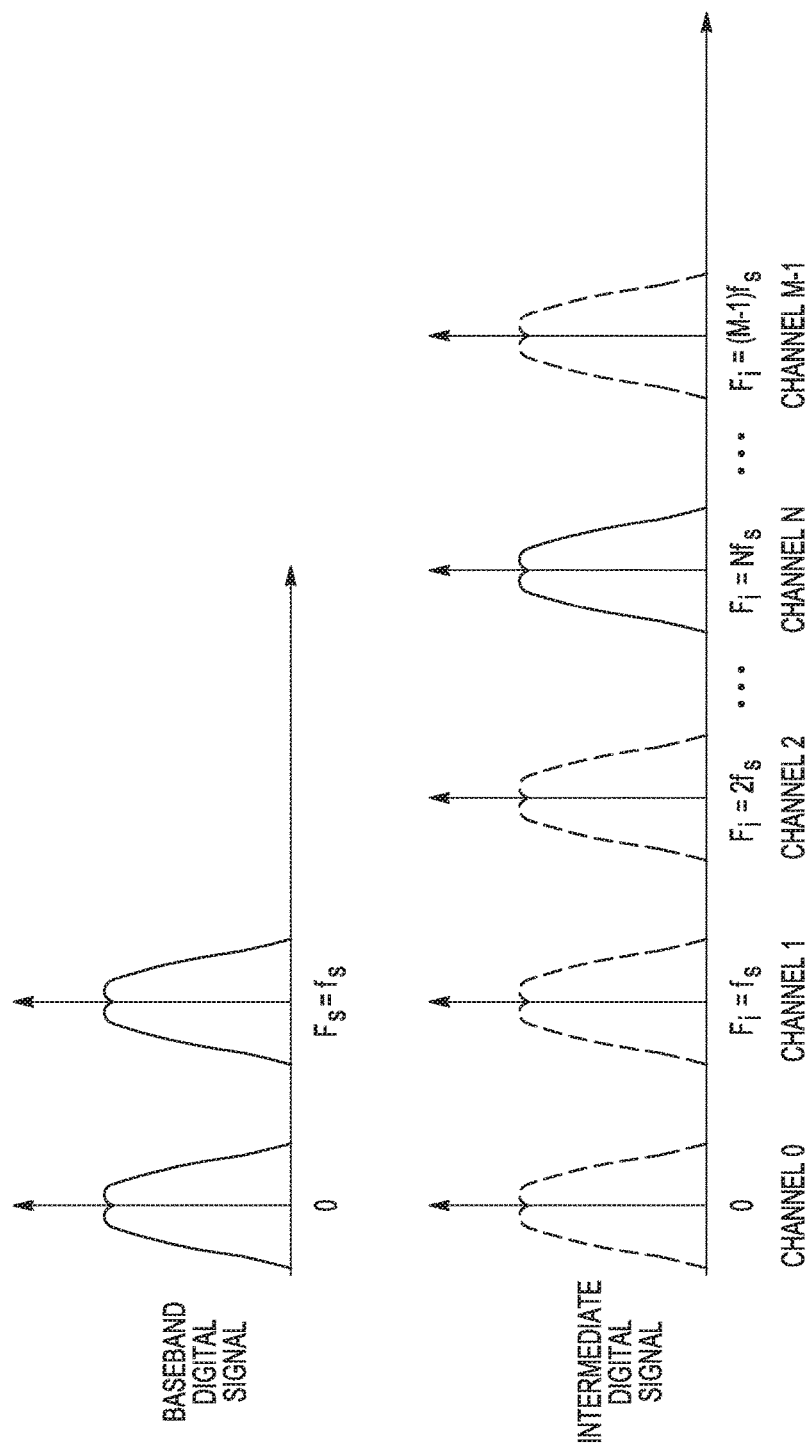
FIG. 4 illustrates simplified waveforms of baseband and intermediate signals of the digital up-converter of FIG. 3.

FIG. 4 illustrates simple waveforms of a baseband signal and images at intermediate frequencies (F) of DUC 50 of FIG. 3. The baseband signal is illustrated at DC and at the input digital baseband sample rate $f_s$. Also in FIG. 4, the digital signal is illustrated at intermediate carrier frequency $F_i=Nf_s$ for a channel of interest of a plurality of channels M from channel 0 to channel M−1. Intermediate carrier frequencies Fi are for a signal at the output of DUC 50 where the sampling rate is $f_o$. Replicated images for the other channels are indicated with dashed lines.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in the above described embodiment, a current electrode is a source or drain and a control electrode is a gate of a metal-oxide semiconductor (MOS) transistor. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A digital up-converter comprising:
    a combinator having an input coupled to receive a digital baseband signal, and an output;
    a first up-sampler having an input coupled to the output of the combinator, and an output;
    a differentiator having an input coupled to the output of the first up-sampler, and an output, wherein the differentiator comprises:
        a summation element having positive input coupled to the output of the first up-sampler, a negative input, and an output; and
        a delay element having an input coupled to the output of the summation element, and an output coupled to the negative input of the summation element;
    a second up-sampler having an input coupled to the output of the differentiator, and an output; and
    a low-pass filter having an input coupled to the output of the second up-sampler, and an output for providing an up-converted digital signal.

2. The digital up-converter of claim 1, wherein the combinator comprises:
  a summation element having a positive input for receiving the digital baseband signal, a negative input, and an output; and
  a delay element having an input for receiving the digital baseband signal, and an output coupled to the negative input of the summation element.

3. The digital up-converter of claim 1, wherein the digital up-converter further comprises a down-sampler having an input coupled to the output of the low-pass filter, and an output.

4. The digital up-converter of claim 1, wherein the digital up-converter comprises a plurality of channels, wherein the digital baseband signal is sampled at an input sample rate, and wherein the output of the differentiator has a sample rate equal to two times the input sample rate times a channel number of a channel of the plurality of channels.

5. The digital up-converter of claim 1, wherein the digital up-converter comprises a plurality of channels, each channel of the plurality of channels having a channel number, and wherein the first up-sampler has an up-sampling factor equal to two times the channel number of one of the plurality of channels.

6. The digital up-converter of claim 1, wherein the low-pass filter is characterized as being one of a finite impulse response (FIR) filter or an infinite impulse response (IIR) filter, the low-pass filter having a cut-off frequency equal to $2\pi/M$, where M is a total number of available channels of the digital up-converter.

7. The digital up-converter of claim 1, wherein the combinator is one of a plurality of series-connected combinators, and wherein the differentiator is one of a plurality of series-connected differentiators.

8. A digital up-converter comprising:
  a plurality of channels, each of the plurality of channels comprising:
    a plurality of combinators connected together in series, each of the plurality of combinators comprising:
      a summation element having a positive input, a negative input, and an output; and
      a delay element having an input coupled to the positive input of the summation element, and an output coupled to the negative input of the summation element;
    a first up-sampler having an input coupled to the plurality of combinators, and an output;
    a plurality of differentiators connected together in series, a first differentiator of the plurality of differentiators having an input coupled to the output of the first up-sampler, each of the plurality of combinators comprising:
      a summation element having positive input coupled to the output of the first up-sampler, a negative input, and an output; and
      a delay element having an input coupled to the output of summation element, and an output coupled to the negative input of the summation element;
    a second up-sampler having an input coupled to the output of a last differentiator of the plurality of differentiators, and an output; and
    a low-pass filter having an input coupled to the output of the second up-sampler, and an output for providing an up-converted digital signal.

9. The digital up-converter of claim 8, wherein the low-pass filter is characterized as being one of a finite impulse response (FIR) filter or an infinite impulse response (IIR) filter, the low-pass filter having a cut-off frequency equal to $2\pi/M$, where M is a total number of the plurality of channels.

10. The digital up-converter of claim 8, wherein the first up-sampler has a sample rate equal to 2N, where N is equal to a channel number of one of the plurality of channels.

11. The digital up-converter of claim 8, wherein the second up-sampler has an up-sampling factor equal to M, where M is equal to the total of number of the plurality of channels.

12. The digital up-converter of claim 8, further comprising a down-sampler having an input coupled to the output of the low-pass filter, and an output.

13. The digital up-converter of claim 12, wherein the down-sampler has a down-sampling factor equal to N, where N is equal to a channel number of one of the plurality of channels.

14. A method for up-converting a digital signal with a digital up-converter from a first sample rate to a second sample rate, the method comprising:
  filtering the digital signal at the first sample rate using a plurality of serially-connected combinator stages;
  up-sampling the filtered digital signal to a first intermediate sample rate;
  differentiating the filtered digital signal at the first intermediate sample rate using a plurality of serially-connected differentiator stages;
  up-sampling the differentiated digital signal to a second intermediate sample rate;
  low-pass filtering the differentiated digital signal with a low-pass filter comprising one of either a finite impulse response (FIR) filter or an infinite impulse response (IIR), the low-pass filter having a cut-off frequency equal to $2\pi/M$, where M is equal to the total number of the plurality of channels; and
  down-sampling the low-pass filtered digital signal to the second sample rate.

15. The method of claim 14, further comprising providing the digital up-converter with a plurality of channels.

16. The method of claim 15, wherein down-sampling the low-pass filtered digital signal to the second sample rate further comprises down-sampling by a down-sampling factor N, where N is equal to the total number of the plurality of channels.

17. The method of claim 15, wherein up-sampling the filtered digital signal to the first intermediate sample rate further comprises up-sampling by an up-sampling factor 2N, where N is equal to a channel number of one of the plurality of channels.

18. The method of claim 15, wherein down-sampling the low-pass filtered digital signal to the second sample rate further comprises down-sampling by a down-sampling factor N, where N is equal to a channel number of one of the plurality of channels.

* * * * *